United States Patent [19]

Fukutake et al.

[11] Patent Number: 5,252,383

[45] Date of Patent: Oct. 12, 1993

[54] CARRIER SHEET FOR PRINTED CIRCUITS AND SEMICONDUCTOR CHIPS

[75] Inventors: Sunao Fukutake; Kazuhiko Ohashi; Takayuki Wani, all of Okayama, Japan

[73] Assignee: Japan Gore-Tex, Inc., Tokyo, Japan

[21] Appl. No.: 906,230

[22] Filed: Jun. 29, 1992

[30] Foreign Application Priority Data

Jul. 2, 1991 [JP] Japan .................. 3-188190

[51] Int. Cl.⁵ ............................... B32B 9/00
[52] U.S. Cl. .................... 428/209; 428/210; 428/901; 428/421
[58] Field of Search .............. 428/209, 210, 901

[56] References Cited

U.S. PATENT DOCUMENTS 5,094,895  3/1992  Branca et al. .................. 428/36.91
5,116,663  5/1992  Fujimoto et al. ................ 428/209

Primary Examiner—Patrick J. Ryan
Assistant Examiner—Cathy Lee
Attorney, Agent, or Firm—Gary A. Samuels

[57] ABSTRACT

A carrier sheet for printed circuits and semiconductor chips having enhanced adhesion of conductive metal layers to a fluororesin surface resulting from rendering the fluororesin surface hydrophilic by a hydrophilic macromolecule before plating the metal onto the surface.

5 Claims, 2 Drawing Sheets

CARRIER SHEET FOR PRINTED CIRCUITS AND SEMICONDUCTOR CHIPS

FIELD OF THE INVENTION

The invention relates to polymer sheets for use as substrates for printed circuits and semiconductor chips.

BACKGROUND OF THE INVENTION

A variety of electronic circuit substrates with a porous fluororesin sheet as an insulating layer are known, including flexible substrates. With these substrates, there have been substantial difficulties in forming a metal plating layer that adheres strongly to the porous fluororesin sheet. A variety of methods have been proposed to solve the problem. For example, for the purpose of raising the adhesive power between a metal plating layer and the through-hole interior walls in a substrate possessing through-holes, a method has been proposed wherein carbon is exposed through alkali metal etching of the through-hole interior wall surfaces, a plating catalyst such as a palladium salt is applied to the carbon, and then a conductive metal is chemically plated on the catalysed surface as shown, for example, in Japanese Laid-Open Patent Applications 59-72472 and 60-225750.

However, with these methods, the adhesive power between the through-hole interior wall surfaces and the plated metal is still inadequate, and defects arise, such as the separation of the plated metal on the interior of the through-holes and barrel cracking, wherein the metal plating layer breaks. Furthermore, by exposing carbon surfaces, electrical characteristics of the substrate at high frequencies are worsened.

Moreover, with electronic circuit substrates and other manufactured products containing a porous fluororesin sheet as an insulating layer, when a metal plating layer is formed on the sheet surface, the adhesive strength between the sheet surface and the metal plating layer is still inadequate.

The present invention overcomes these difficulties and provides a manufactured product wherein the adhesive power between a porous fluororesin sheet insulating layer and a metal plating layer is raised.

SUMMARY OF THE INVENTION

It has been heretofore discovered that when a metal plating treatment is performed on a porous fluororesin sheet via a hydrophilic macromolecule, the adhesive power between the sheet and the plated metal is markedly enhanced, and manufactured products are obtained with high reliability and high quality wherein defects such as the separation of the plated metal and barrel cracking do not arise.

In the present invention, an electronic circuit substrate is made of a porous fluororesin sheet as an insulating layer and a metal plating layer on the sheet surface, the metal plating layer adhering to the sheet via a hydrophilic macromolecule. The substrate sheet also possesses through-holes which also can be metal plated with adhesion of the plating on the walls of the holes treated with a hydrophilic macromolecule. The same adherence of metal plating applies to metal printed circuitry on the surface of the substrate or to the surface of a semiconductor chip made from the substrate of the invention.

The porous fluororesin sheets used in a substrate or for a semiconductor chip carrier in the present invention have been well known in the past, and possess communicating micropores having an average pore diameter of 100 μm or less. In this case, drawing and expansion, foaming, extraction, and other techniques are used as the means for forming these pores. The varieties of fluororesins include polytetrafluoroethylene (PTFE), tetrafluoroethylene-hexafluoropropylene copolymers, poly(vinyl fluoride), and poly(vinylidene fluoride). In the present invention, the use of porous polytetrafluoroethylene, particularly drawn or expanded porous polytetrafluoroethylene (ePTFE), is preferred.

A porous fluororesin sheet that is preferred for use as an insulating layer in the present invention is composed of an EPTFE polytetrafluoroethylene material of average pore diameter of 100 μm or less, preferably 50 μm or less, and possessing a porosity of 15 to 95%, described in Japanese Patent Publications 56-45773 and 56-17216 and in U.S. Pat. No. 4,187,390, for example.

The products of the present invention are characterized by containing one or a plurality of porous fluororesin sheets as an insulating layer, by having metal plating caused to adhere to the sheet surface or to the interior wall surfaces of through-holes in the sheet pertaining to at least one of these porous fluororesin sheets, and by the fact that this plated metal is caused to adhere to the sheet surface or to the interior wall surfaces of through-holes in the sheet via a hydrophilic macromolecule adhesion bonded to the sheet. Specifically, in the present invention, the formation of a metal plating layer on a porous fluororesin sheet is conducted through a typical chemical plating treatment after a hydrophilic macromolecule has been adhered to the sheet.

DETAILED DESCRIPTION OF THE INVENTION

Figure 1:
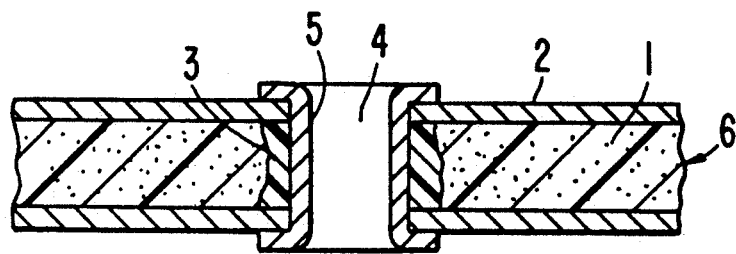
FIG. 1 is a cross-sectional view of a substrate of the invention having through-holes.

The invention is now described in detail to delineate the details of the compositions and articles of manufacture of the invention, including reference to the figures.

A wide variety of polymers possessing hydrophilic groups can be used as the hydrophilic macromolecule that is adhesion bonded to the porous fluororesin sheet. Examples of hydrophilic groups include hydroxyl groups, carboxyl groups, sulfone groups, cyano groups, pyrrolidone groups, isocyanate groups, imidazole groups, phosphoric acid groups, amide groups which may be N-substituted, amino groups which may be N-substituted, and sulfonamide groups. An alkylene oxide, such as ethylene oxide or propylene oxide, may react with an active hydrogen on these hydrophilic groups to add hydroxyalkyl groups to the molecules to add or provide hydrophilicity.

The hydrophilic macromolecule may be water soluble. In this case, it is difficult to maintain the macromolecule adhered to a sheet until the chemical plating process, and the macromolecule may be eluted during preparatory treatment processes for the chemical plating.

The risk is run that sufficient hydrophilicity may not be maintained in the surfaces within the pores in the sheet surface. Therefore, in the present invention, it is preferred that a macromolecule which displays solubility in organic solvents and displays only slight solubility in water or aqueous liquids, and preferably a macromolecule which displays essentially no water solubility, be used as the hydrophilic macromolecule.

A wide variety of synthetic and natural macromolecules can be used as the hydrophilic macromolecule, including poly(vinyl alcohols), poly(acrylic acids), polyacrylonitrile, polyvinyl sulfone, polyurethane, polyethylene oxide, starches, carboxylmethyl cellulose, ethyl cellulose, sodium alginate, gluten, collagen, and casein.

From the standpoint of adhesion to the sheet, the use of fluorine-containing hydrophilic macromolecules is particularly preferred. This sort of fluorine-containing hydrophilic macromolecule can be obtained by bringing about a copolymerization reaction between a fluorine-containing ethylenic unsaturated monomer and a hydrophilic group-containing vinyl monomer that does not contain fluorine. Examples of fluorine-containing monomers include tetrafluoroethylene, vinyl fluoride, vinylidene fluoride, monochlorotrifluoroethylene, dichlorodifluoroethylene, and hexafluoropropylene.

Preferred fluorine-containing monomers can be represented by the general formula $CXY=CFZ$, where X and Y are selected from hydrogen, fluorine, chlorine, and trifluoromethyl group. Other preferred fluorine-containing monomers may include $CH_2=CRCO_2R_f$, $CH_2=CROCOR_f$, $CH_2=CROR_f$, and $CH_2=CRCONHRf$, in which R is hydrogen, fluorine, methyl, ethyl, trifluoromethyl ($-CF_3$), or pentafluoroethyl ($-C_2F_5$). Rf represents a fluoroalkyl group of 4–21 carbon atoms.

Vinyl monomers possessing the above hydrophilic groups and monomers, wherein an alkylene oxide, such as ethylene oxide or propylene oxide, has been subjected to an addition reaction on an active hydrogen in the hydrophilic groups thereof, are ideal as the hydrophilic group-containing monomer. Materials wherein a hydrophilic copolymer is produced by hydrolysis after copolymerization, as with vinyl acetate, may also be used.

Specific example of hydrophilic monomers include vinyl alcohol, acrylic acid, methacrylic acid, fumaric acid, maleic acid, itaconic acid, and other such unsaturated carboxylic acids, as well as aklylene oxide adducts of acrylic acid and methacrylic acid, such as:
$CH_2=CRCO_2(C_2H_4O)_mH$, $CH_2=CRCO_2(C_3H_6))_mH$,
$CH_2=CRCO_2(C_3H_6O)_m(C_2H_4O)_nH$, and
$CH_2=CRCONH(CH_2)_3NH_2$, wherein
R is a hydrogen or a methyl group, and n and m are integers equal to or greater than 1.

One or two or more species of either the fluorine-containing monomer and/or the hydrophilic group-containing monomer may be used. Other vinyl monomers, such as aklyl esters of acrylic acid and methacrylic acid, and esters of acrylic acid or methacrylic acid and polyhydric alcohols, such as trimethylolpropane, can be used in combination if necessary for the fluorine-containing monomer and hydrophilic group-containing monomer.

Copolymers of vinyl alcohols and fluorine-containing monomers that are preferred for use as the hydrophilic macromolecule in the present invention can be obtained by saponifying a copolymer of vinyl acetate and a fluorine-containing monomer, and converting the acetate groups contained in the copolymer into hydroxyl groups. In this case, the acetate groups contained in the copolymer do not all necessarily have to be converted into hydroxyl groups; it is sufficient for the conversion of acetate groups into hydroxyl groups to be conducted to an extent such that the copolymer is hydrophilic.

The fluorine content of a fluorine-containing hydrophilic copolymer preferably used in the present invention should normally be 2% to 60%, and preferably 10% to 60%, and even more preferably 20% to 60%, by weight. If the fluorine content of the fluorine-containing hydrophilic copolymer is too high, although the heat resistance is improved, the hydrophilicity of the polymer is reduced. On the other hand, if the fluorine content is too low, heat resistance is reduced.

The hydrophilic group equivalent in the fluorine-containing hydrophilic copolymer in the present invention is generally 45 to 700, and preferably 60 to 500, and even more preferably 60 to 450. When the hydrophilic group equivalent thereof is less than 45, the solubility of the fluorine-containing hydrophilic copolymer becomes extremely great, and the copolymer readily elutes from the sheet in water. On the other hand, if the hydrophilic group equivalent exceeds 700, the hydrophilicity becomes too low, and the sheet cannot be rendered hydrophilic.

The mol % of fluorine-containing monomer units, the fluorine weight % (F-wt. %), and the hydrophilic group equivalent (Eq-W) in a number of copolymers are shown in Tables 1 and 2. VOH is vinyl alcohol.

What is referred to in the present specification as the hydrophilic group equivalent (Eq-W) is the value obtained when the molecular weight of a copolymer is divided by the number of hydrophilic groups. The hydrophilic group equivalents shown below have been calculated according to the formula:

$Eq\text{-}W=(A\cdot x)+(B\cdot y)/y$, in which

A·x is the value obtained when the molecular weight of the fluorine-containing monomer (A) is multiplied by the number of moles thereof (x). B·y is the value obtained when the molecular weight of the hydrophilic group-containing monomer (B) is multiplied by the number of moles thereof (y).

TABLE 1

| Copolymer | Mole Ratio in Copolymer | | Mol % of Fluorine-Containing Monomer Units in Copolymer | F-wt % | Eq-W |
| --- | --- | --- | --- | --- | --- |
| $(CF_2=CF_2)x/(VOH)y$ | x = 1, | y = 40 | 2.4 | 4.2 | 45.5 |
| | 1, | 30 | 3.2 | 5.5 | 46.4 |
| | 1, | 20 | 4.8 | 7.9 | 48.0 |
| | 1, | 10 | 9.1 | 14.3 | 53 |
| | 1, | 4 | 20 | 27.5 | 68 |
| | 1, | 1 | 50 | 53.1 | 143 |
| | 10, | 1 | 91 | 72.8 | 1043 |
| $(CF_2=CFH)./(VOH)y$ | x = 1, | y = 40 | 2.4 | 2.1 | 44.6 |

TABLE 1-continued

| Copolymer | Mole Ratio in Copolymer | | Mol % of Fluorine-Containing Monomer Units in Copolymer | F-wt % | Eq-W |
|---|---|---|---|---|---|
| | 1, | 30 | 3.2 | 2.8 | 45.2 |
| | 1, | 20 | 4.8 | 4.1 | 46.2 |
| | 1, | 10 | 9.1 | 7.5 | 49 |
| | 1, | 4 | 20 | — | — |
| | 1, | 1 | 50 | 33.6 | 107 |
| | 10, | 1 | 91 | 55.6 | 683 |
| $(CFH=CH_2)_x/(VOH)_y$ | $x =$ 1, | $y =$ 40 | 2.4 | 1.1 | 44.2 |
| | 1, | 30 | 3.2 | 1.4 | 45.6 |
| | 1, | 20 | 4.8 | 2.1 | 45.3 |
| | 1, | 10 | 9.1 | 4.0 | 47.6 |
| | 1, | 4 | 20 | — | — |
| | 1, | 1 | 50 | 21.3 | 89 |
| | 10, | 1 | 91 | 37.8 | 503 |

TABLE 2

| Copolymer | Mole Ratio in Copolymer | | Mol % of Fluorine-Containing Monomer Units in Copolymer | F-wt % | Eq-W |
|---|---|---|---|---|---|
| $(CF_2=CFCl)_x/(VOH)_y$ | $x =$ 1, | $y =$ 40 | 2.4 | 3.1 | 46.0 |
| | 1, | 30 | 3.2 | 4.0 | 46.9 |
| | 1, | 20 | 4.8 | 5.8 | 48.9 |
| | 1, | 10 | 9.1 | 10.4 | 54.6 |
| | 1, | 4 | 20 | — | — |
| | 1, | 1 | 50 | 35.8 | 159 |
| | 10, | 1 | 91 | 47.2 | 1208 |
| $(CF_2=CCl_2)/(VOH)_y$ | $x =$ 1, | $y =$ 40 | 2.4 | 2.0 | 46.6 |
| | 1, | 30 | 3.2 | 2.7 | 47.7 |
| | 1, | 20 | 4.8 | 3.8 | 50.0 |
| | 1, | 10 | 9.1 | 6.7 | 57 |
| | 1, | 4 | 20 | — | — |
| | 1, | 1 | 50 | 20.8 | 183 |
| | 10, | 1 | 91 | 26.3 | 1442 |
| $(CF_2=CFCF_3)_x/(VOH)_y$ | $x =$ 1, | $y =$ 40 | 2.4 | 6.1 | 46.8 |
| | 1, | 30 | 3.2 | 7.9 | 48.0 |
| | 1, | 20 | 4.8 | 11.3 | 50.5 |
| | 1, | 10 | 9.1 | 19.6 | 58 |
| | 1, | 4 | 20 | — | — |
| | 1, | 1 | 50 | 59.0 | 193 |
| | 10, | 1 | 91 | 73.9 | 1543 |

In order to bring about the adhesion of the hydrophilic macromolecule to the surface portion of the sheet, the fluorine-containing hydrophilic copolymer is, for example, dissolved in an alcohol, ketone, ester, amide, hydrocarbon, or another such organic solvent. The sheet is immersed in this solution or the solution is used to impregnate the sheet through a coating method in which a sprayer or roller is used, after which drying is performed. Thus, the hydrophilic macromolecular material adheres to the interior surfaces of the sheet, and water can penetrate into the micropores. The amount of the hydrophilic macromolecule that adheres to the sheet should be sufficient to raise the hydrophilicity of the sheet, and the amount therefore should be sufficient to raise the hydrophilicity of the sheet, and the amount therefore varies with the porosity of the sheet. However, the amount should usually be 1.5 to 10 wt. % and preferably 2 to 6 wt. % with respect to the weight of the final product.

The hydrophilic porous fluororesin sheet can also be manufactured by impregnating it with an organic solvent solution of a copolymer composed of a fluorine-containing monomer and a hydrophobic monomer with which conversion into hydrophilic groups is possible, such as vinyl acetate, drying the sheet, and then converting at least part of the acetate groups to hydrophilic groups.

A hydrophilic fluororesin sheet formed in the manner described above possesses a structure wherein a hydrophilic macromolecule is bonded in the form of a film or a powder to the pore inner surfaces of the sheet. This structure makes the pore interiors of the sheet capable of penetration by and transmission of water and a wide variety of aqueous solutions. By setting the hydrophilic group equivalent of the hydrophilic macromolecule to within an appropriate range and controlling the solubility of the macromolecule with respect to water, the elution of the copolymer itself from the sheet can be prevented. The adhesion bonding strength of the fluorine-containing hydrophilic copolymer with the porous fluororesin sheet is heightened in comparison with other hydrophilic macromolecules through the action of the fluorine atoms in the hydrophilic copolymer, so that the durability thereof can be maintained stable over extended periods of time.

By performing an advance treatment to facilitate chemical plating on a hydrophilic fluororesin sheet obtained in the manner described above (also referred to as the hydrophilized sheet), and then conducting a chemical plating treatment, a metal plating layer can be formed on this sheet. Each process whereby the advance treatment and chemical plating treatment are performed may be conducted according to methods that have been commonly known in the past.

Specifically, in the advance treatment process, a noble metal is caused to adhere to the pore inner surfaces of the sheet as a catalyst for chemical plating.

Palladium as well as platinum and gold may be used as the noble metals, with palladium being preferred. A method wherein the sheet is immersed in an aqueous solution of tin(II) chloride, washed, immersed in an aqueous solution of palladium chloride, and then washed, for example, may be employed as the method for bringing about the adhesion of the noble metal. This sort of advance treatment for chemical plating is a well-known technique.

The chemical plating solution usually contains a metal, a reducing agent, a complexing agent, a buffer agent, and a stabilizing agent. Sodium hypophosphite, sodium borohydride, aminoborane, formalin, hydrogen, and the like may be used as the reducing agent. Formic acid, acetic acid, succinic acid, citric acid, tartaric acid, maleic acid, glycine, ethylenediamine, ethylenediaminetetraacetic acid, triethanolamine, sodium potassium tartrate, and the like may be used as the complexing agent and the buffer agent.

A wide variety of metals, including gold, silver, platinum, rhodium, nickel, cobalt, tungsten, copper, zinc, and iron, as well as alloys of these metals, may be used as metals for plating. Of these, copper is preferred.

The manufactured products of the invention encompass substrates possessing through-holes. A specific example of these substrates is shown in FIG. 1. FIG. 1 depicts a cross-sectional view of a substrate 6 having a through-hole 4 in a plate 6 which has a copper cladding layer 5 on both surfaces owing to copper foil 2 having been affixed to both surfaces of an insulating layer of porous fluororesin sheet 1 and adhering a hydrophilic macromolecule to the interior wall surface of through-hole 4 and then metal-plating through-hole 4. In this figure, 3 depicts the portion of the sheet in which both the hydrophilic macromolecule and the plating metal are present, i.e. the portion in the interior wall surface of through-hole 4 in which a plating metal 5 has been caused to adhere via a hydrophilic macromolecule that has been adhered to the interior wall surface.

The surface portion of the interior wall of through-hole 4 in the porous fluororesin sheet has a structure consisting of fibrils and nodes and resembles the structure of a spider web. The interior wall portion of through-hole 4 is rendered hydrophilic through the adhesion of a hydrophilic macromolecule to the surface of these fibrils and nodes. For the purpose of performing an advance treatment for metal plating on through-hole 4 interior wall surface that has been rendered hydrophilic, divalent tin ions are adsorbed thereto, after which palladium chloride is applied as catalyst. Metallic palladium (Pd) is deposited on the surface that has been rendered hydrophilic, and this surface activated. When chemical plating (electroless plating) is conducted on this activated surface, the fibrils and nodes that have been activated act as nuclei, and the metal is caused to adhere and to grow, with a metal plating layer 5 being formed continuously in the form of a round tube on through-hole 4 interior wall surface. Through-hole 4 communicates electrically with the upper and lower copper foil layer 2.

Metal plating layer 5 on the interior wall surface of through-hole 4 is caused to adhere strongly to through-hole 4. Defects such as the separation of the plated metal on the interior of through-holes and barrel cracking do not occur, thus affording a substrate of high quality and high reliability. Manufactured products or substrates wherein a conventional porous fluororesin surface is etched with an alkali metal to expose carbon and a metal plating layer is formed thereupon experience adhesion only at the surface and sufficient adhesive power has heretofore been impossible to attain. However, by allowing a hydrophilic macromolecule to penetrate deeply into the surface of the through-hole interior walls and allowing the plating metal also to penetrate deeply into this surface, as in the present invention, an anchoring effect is achieved, and the adhesive power is raised substantially. In this manner, the metal plating layer formed on the through-hole interior walls can be prevented from the defect of separation from said interior wall surfaces and from undergoing barrel cracking wherein the metal plating layer is broken. The reliability of the substrate is substantially enhanced. A tetrafluoroethylene/vinyl alcohol copolymer is preferred for use as the hydrophilic macromolecule. This material excels in terms electrical characteristics, possessing a low specific inductive capacity of 2.9 (6 GHz). Even if this material is adhered to a porous fluororesin sheet, the excellent electrical characteristics possessed by the porous fluororesin sheet such as low specific inductive capacity, low transmission delays and low cross talk, for example, are not significantly impaired. The depth to which the plating metal penetrates the inner portion of the through-hole interior walls is usually in the range of 0.1 to 100 $\mu$m and preferably 1 to 10 $\mu$.

The distance to which the hydrophilic macromolecule penetrates into the porous fluororesin sheet can be specifically controlled according to the type of organic solvent and the amount of water added in the treatment solution containing the hydrophilic macromolecule that is used. Moreover, the electrical characteristics of the sheet possessing a metal plating layer that is thereby formed can also be varied.

A typical plating sequence is as follows. A porous EPTFE film with a porosity of 70% and a thickness of 260 $\mu$m ($\epsilon R$ = 1.25, tan $\delta$ = 1.5×10$^{-4}$ (6 GHz)) was immersed in a treatment solution for hydrophilization in which a tetrafluoroethylene/vinyl alcohol copolymer (TFE/VA copolymer) had been dissolved, after which a hydrophilized EPTFE film was obtained by drying, the characteristics ($\epsilon R$ and tan $\delta$) thereof being shown in Table 3.

TABLE 3

| Sample No. | Composition of Treatment Solution (wt %) | | | Film Characteristics | |
|---|---|---|---|---|---|
| | TFE/VA copolymer | Solvent | Water | $\epsilon r$ | tan$\delta$ |
| 1 | 0.3 | 89.7 | 10 | 1.25 | $1.5 \times 10^{-4}$ |
| 2 | 1.0 | 89 | 10 | 1.26 | $1.7 \times 10^{-4}$ |
| 3 | 1.0 | 99 | — | 1.29 | $8.4 \times 10^{-4}$ |

In Table 3, the solvent for Samples No. 1 and 2 was a mixed solvent of methanol and ethanol (mixing weight ratio = 1:1) and the solvent for Sample No. 3 was methanol.

$\epsilon R$ represents the specific induction capacity and tan $\delta$ represents the dielectric loss tangent. These characteristics were measured at a frequency of 6 GHz.

When electroless plating was performed on each of the above hydrophilized samples according to normal methods, it was confirmed that the copper plating layer formed on each sample surface possessed sufficient adhesive strength. Furthermore, the order of the samples subjected to a copper plating treatment, in terms of the excellence of their electrical characteristics, was No. 1, No. 2, and then No. 3, indicating that Sample No. 1 exhibited the best electrical characteristics.

Recently, there has been a trend to increase the number of through-holes per unit surface area of a substrate possessing through-holes, and it has been believed that defects may result in the sheet between neighboring through-holes. The penetration depth of the hydrophilic macromolecule should thus be set at a value of 100 μm or less in consideration of this point.

In the manufacture of the substrate of the present invention possessing through-holes wherein a porous fluororesin sheet is used as an insulating layer, a hydrophilization treatment in which a hydrophilic macromolecule is used can easily be performed before the chemical plating treatment thereof in conventional manufacturing methods. For example, in the formation of through-holes on which a metal plating layer is to be formed on the interior wall surfaces, in a laminated substrate composed of a porous fluororesin sheet wherein copper foil has been affixed to both surfaces, holes are opened in the laminated substrate, after which the impregnation of a hydrophilization treatment solution containing a hydrophilic macromolecule into the through-hole interior wall surfaces is brought about. Drying is then performed. A catalytic treatment, plating resist coating treatment, and electroless copper plating treatment are then performed according to normal methods and, finally, a resist-removal treatment is performed. Furthermore, when a metal plating layer pattern is to be formed on a substrate surface at the same time as a metal plating layer is to be formed on the interior surfaces of the through-holes, holes are opened in a porous fluororesin sheet, after which a photomask of the desired pattern is formed on both surfaces of the sheet according to normal methods. Next, the exposed portions of the sheet which the photomask has not covered and the interior wall surfaces of the through-holes are impregnated with a hydrophilization treatment solution containing a hydrophilic macromolecule, after which drying is performed. Thereafter, a catalytic treatment, electroless plating treatment, and a photoresist-removal treatment are performed in this order.

In a through-holes possessing substrate of present invention, it is effective to use a composite wherein a porous fluororesin sheet has been laminated with a ceramic substrate as the insulating layer thereof. Ceramic substrates have the advantage that, in addition to excelling in terms of dimensional stability, they excel in terms of heat-radiating and electrical resistance properties. On the other hand, they have the significant drawback that they have high specific induction capacities. However, although porous fluororesin sheets possess the advantage of low specific induction capacities, they are heat-shrinkable and are inadequate from the standpoint of dimensional stability. Moreover, they are inferior to ceramic substrates in terms of heat-radiating and electrical resistance properties. With a composite wherein a porous fluororesin sheet has been laminated to a ceramic substrate, the heat-shrinking of the porous fluororesin sheet is controlled by the ceramic substrate, the dimensional stability of the sheet at high temperatures is therefore enhanced, and the composite as a whole excels in terms of both dimensional stability and heat-radiating and electrical resistance properties.

In a substrate composed of this sort of composite, only a power source layer is formed on the ceramic substrate and a signal layer is formed on the porous fluororesin sheet. An electronic circuit substrate can thus be obtained that, along with excelling in terms of dimensional stability and heat radiating and electrical resistance properties, produces a sharp signal wave form because the signal layer is formed on a porous fluororesin sheet with a low specific induction capacity. When a signal layer is provided on a ceramic substrate, a sharp signal wave form cannot be obtained because the specific induction capacity of the ceramic substrate is appreciably high.

The bonding in lamination of the ceramic substrate and the porous fluororesin sheet can be obtained through press bonding at an elevated temperature with the use of a fluororesin such as PTFE, a copolymer of tetrafluoroethylene and hexafluoropropylene, poly(vinyl fluoride), and the poly(vinylidene fluoride) or a thermosetting resin such as an epoxy or polyimide as the bonding materials.

The manufacture of the above substrate possessing through-holes, wherein a composite composed of a porous fluororesin sheet and a ceramic substrate is used as the insulating layer, can also be performed in the same manner as that shown above for the manufacture of a through-hole substrate containing only a porous fluororesin sheet. According to the present invention, the formation of a metal plating layer on a ceramic substrate can readily be implemented by performing said formation via a hydrophilic macromolecule. It has been confirmed that the metal plating layer formed on the surface thereof possesses a strong bonding strength and that no separating or barrel cracking problems are generated.

Figure 2:
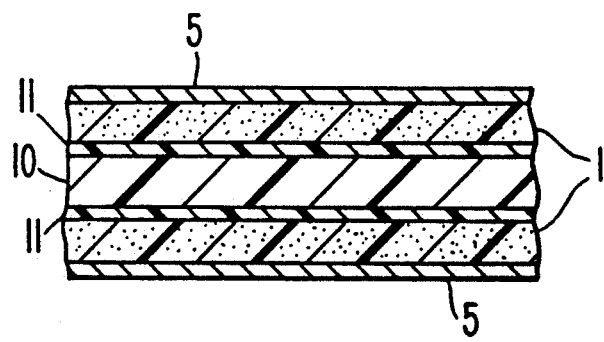
FIG. 2 is a cross-sectional view of a flexible substrate of the invention.
Figure 3:
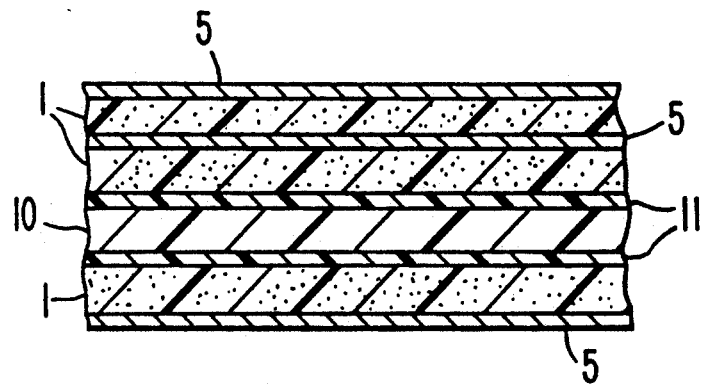
FIG. 3 is a cross-sectional view of another flexible substrate of the invention.

The manufactured products of the present invention encompass flexible substrates. One example is shown in FIG. 2. FIG. 2 is a cross-sectional view of a flexible substrate wherein porous fluororesin sheets 1 have been formed on both surfaces of a flexible resin sheet 10 via a bonding layer 11, and metal plating layers 5 have been formed on sheets 1 via hydrophilic macromolecules. In addition to thermosetting resins such as polyimides, thermoplastic resins such as polycarbonate, polysulfone, polyether ether ketone, polyamide, acrylonitrilebutadiene-styrene terpolymer, polyacetal, polyphenylene sulfide, and the like may be used as this flexible resin 10. Fluororesins such as fluorinated ethylene-propylene copolymer, ethylenetetrafluoroethylene copolymer, and polytetrafluoroethylene perfluoroalkyl vinyl ether, as well as polyimides, epoxies, and other such resins for adhesion are used as the bonding layer 11. Furthermore, metal plating layers 5 that are formed on the surface of porous fluororesin sheets 1 can be formed by impregnating the sheet surface with a solution containing a hydrophilic macromolecule, drying, catalytic treatment, and chemical plating treatment in that order. In the flexible substrate shown in FIG. 2, one of the two metal plating layers 5 may be omitted if necessary. A variation on the flexible substrate shown in FIG. 2 is shown in FIG. 3.

EXAMPLES

The invention will now be described in further detail by means of working examples and reference examples.

For porous fluororesin sheets the following characteristics and properties were determined by the methods described below:

Thickness

The thickness was measured with a dial thickness gauge with a precision of 1/1000 mm.

Ethanol Bubble Point (EBP)

Ethanol was spread over the surface of a sample sheet, the sample was placed horizontally on a fixing apparatus, and the EBP was measured. Here, air was blown from below the sample. The EBP is the initial pressure (kg/cm$^2$) at the point air bubbles are continuously exiting from the surface on the reaction side. The average pore diameter can be calculated from the EBP by a method such as ASTM-F-316-80, wherein the pore size is obtained by an instrument, Model No. "Poro" (Cutler Electronics Ltd.). The pore size distribution curve for a sample sheet is automatically obtained by the instrument. The integration curve is divided by 2 to obtain the average pore diameter.

Porosity

The porosity of a sheet prior to impregnation with a hydrophilic macromolecule (referred to below simply as a pre-impregnation sheet) was obtained by measuring the density of the material. The density of the material (polytetrafluoroethylene) was 2.2 g/cm$^3$. The porosity was calculated using the following equation.

$$Porosity = (2.2 - sample\ density) \div 2.2 \times 100$$

In the calculation of the porosity of a sheet after impregnation with a hydrophilic macromolecule (referred to below simply as a post-impregnation sheet), a density of 2.1 g/cm$^3$ was used in place of the 2.2 g/cm$^3$.

Flow Time

The flow time is the amount of time required for 200 ml. of water to pass through a sheet with a thickness of 35 mm under a vacuum of one atmosphere. A sheet was fixed horizontally and water was poured over it. A suction was then applied from below. When measuring a preimpregnation sheet, the sample sheet was first impregnated with ethanol to make the sheet hydrophilic.

Durability

The durability of a sheet after an impregnation treatment is an indication of its hydrophilicity after undergoing five Flow Time tests (and being dried after each test), or after ten liters of water had passed through using a flow test machine and method.

Fluorine and Hydroxyl Group Content

The fluorine content and the hydroxyl group content were determined through calculation.

Water Permeability (WP)

The WP was determined with the following equation.

$$WP = 200 \div (flow\ time - 60 \times (1.75)^2 \times 3.14)$$

Heat Resistance

The heat resistance was determined by fixing a sample sheet in a frame, leaving the sheet in an air oven set at the test temperature, and then measuring the hydrophilicity in the manner given below.

Gurley Number (GN)

The GN was determined by measuring the amount of time required for 100 cm$^3$ of air to pass through a sample with a surface area of 6.45 cm$^3$ under a water pressure of 12.4 cm.

Acid, Alkali, and Solvent Resistance

A sample sheet was immersed in a solution for a specified duration. After drying, its hydrophilicity was measured in the manner given below.

Hydrophilicity

The initial hydrophilicity was determined by dropping a drop of water onto a sample sheet from a height of 5 cm., and measuring the time needed for the water drop to be adsorbed. The hydrophilicity was evaluated in the following manner.

A. Absorbed in one second or less.
B. Absorbed naturally.
C. Absorbed only under pressure.
D. No absorption, but reduction in the contact angle.
E. No absorption. That is, the water is repelled. This E evaluation is characteristic of porous fluororesin sheets.

REFERENCE EXAMPLE 1

A tetrafluoroethylene/vinyl alcohol copolymer was dissolved in methyl ethyl ketone to prepare a 0.3 wt. % solution. An EPTFE sheet with a thickness of 40 μm and a porosity of 80% was impregnated with the solution, fixed in a frame, and dried at 60° C. for five minutes. The same process was repeated five times. The sheet thus obtained was saponified by immersing it in ethanol containing sodium methoxide and then heat treating it for 30 minutes and the saponified hydrophilic sheet then washed with water. This sheet displayed the same characteristics as the sheet in Reference Example 1.

COMPARATIVE REFERENCE EXAMPLE 1

An EPTFE sheet with a thickness of 40 μm and a porosity of 80% was impregnated for 20 minutes with a 5 wt. % isopropanol (FC-93, made by 3M) that served as a surfactant and was then dried at room temperature to produce a hydrophilic sheet. The stability of this sheet was poor and the hydrophilicity was lost when 200 ml. of water had been passed through the sheet only five times.

REFERENCE EXAMPLE 2

An ePTFE sheet with a thickness of 48 μm a GN of 6.1 seconds, an EBP of 1.15 kg/cm$^2$, a porosity of 76%, and a flow time of 36 seconds was immersed for 30 seconds in the 1% methanol solution of the copolymer used in Reference Example 1, fixed in a frame after removal, and dried at room temperature for one hour. The sheet thus obtained had a copolymer content of 0.75 kg/m$^2$, porosity 71%, flow time 56 seconds, and WP speed 20 cm$^3$/m$^2$ minute.

A hydrophilicity durability test was performed after either passing 200 ml. of water five times through an impregnated sheet, drying after each time (Method 1) or passing 10 l. of water through continuously (Method 2). The results were as follows:

| Durability Test Conditions | Hydrophilicity Test Results |
| --- | --- |
| Method 1 | A |
| Method 2 | A |

An impregnated sheet was subjected to a five-time flow time test. Drying was performed after each test. Upon then subjecting this sheet to a hydrophilicity test, it was given an A rating. For another impregnated sample sheet, a flow time test machine and test method were used to pass 10 l. of water through the sheet continuously. This sheet received an A rating in the hydrophilicity test.

To measure heat resistance, an impregnated sheet was first subjected to a heat treatment at the temperatures and for the durations given below and then to a hydrophilicity test, affording the following results.

| Temperature | Duration | Hydrophilicity Test Results |
| --- | --- | --- |
| 100° C. | 30 hours | A |
| 120° C. | 5 hours | B (absorption after 60 seconds) |
| 120° C. | 24 hours | B (absorption after 60 seconds) |
| 120° C. | 48 hours | B (absorption after 120 seconds) |
| 120° C. | 2 hours | C or D |
| 150° C. | 24 hours | D |
| 200° C. | 1 hour | D |

To measure oxidation resistance, after immersing an impregnated sheet under the oxidation conditions shown below for the durations shown below, a hydrophilicity test was conducted, affording the following results.

| Oxidant | Temperature | Duration | Hydrophilicity Test Results |
| --- | --- | --- | --- |
| 1 N hydrocoloric acid | 80° C. | 2 hours | A |
| 3 N nitric acid | room temp. | 350 hours | A |
| 12 N nitric acid | room temp. | 1 hour | A |

To measure alkali resistance, after immersing an impregnated sheet under alkaline conditions and for the durations shown below, a hydrophilicity test was conducted, affording the following results.

| Alkali | Temperature | Duration | Hydrophilicity Test Result |
| --- | --- | --- | --- |
| 1 N sodium hydroxide | 80° C. | 1 hour | A |
| 3 N sodium hydroxide | 80° C. | 5 hours | D |
| 12 N sodium hydroxide | room temp. | 36 hours | A |

To determine organic solvent resistance, after passing the solvents shown below through an impregnated sheet, a hydrophilicity test was conducted, affording the following results:

| Solvent | Flow-Through Amount | Hydrophilicity Test Results |
| --- | --- | --- |
| Methanol | 300 ml. | A |
| Ethanol | 2000 ml. | A |
| Acetone | 5000 ml. | A |

Even though methanol is a good solvent of the copolymer, the hydrophilicity rating was A after 300 ml. of methanol had been passed through the sheet. Ethanol and acetone are not good solvents of the above copolymer.

PRACTICAL EXAMPLE 1

Copper foil was affixed to both surfaces of an EPTFE sheet to produce a laminated plate with copper cladding on both surfaces. The thickness of this EPTFE sheet was 260 μm, porosity 70%, and the diameter of its pores 0.2 μm.

Through-holes with a diameter of 0.4 mm were opened in the laminated plate obtained in the manner described above, the plate then immersed in a methanol solution containing 1 wt. % of a tetrafluoroethylene/vinyl alcohol copolymer. A hydrophilization treatment was performed on the through-hole interior walls by impregnating EPTFE porous body with this solution. After the laminated plate was dried, it was immersed in a 2 wt. % $SnCl_2$ solution and a 0.1 wt. % $PdCl_2$ solution in order, and a palladium catalyst was formed in the surface portion (the hydrophilized portion) of the through-hole interior walls. Next, both surfaces of the laminated plate subjected to such treatments were coated with a plating resist, excluding the mouth edges of the through-holes, after which the plate was immersed for two hours in a copper electroless plating bath at room temperature containing 0.4 wt. % $CUSO_4 \cdot 5H_2O$, 1.4 wt. % Rochelle salt, 0.6 wt. % NAOH, and 4 wt. % formaldehyde. Copper was deposited and grown on the through-hole interior wall surfaces. Next, the resist on both sides of the laminated plate was removed from the copper foil surface, and quick etching was performed on the antimony and palladium affixed to the copper foil surface to give an EPTFE laminated substrate with copper cladding on both surfaces as shown in FIG. 1.

PRACTICAL EXAMPLE 2

Three laminated plates A with a structure wherein both sides of an epoxy resin containing a glass cloth reinforcing material were laminated with copper foil, and two prepregs B formed by coating a PTFE porous body with an epoxy resin, were laminated in an alternating fashion in a manner such that the laminated construction had the arrangement A/B/A/B/A. This laminate was subjected to thermocompression bonding to produce a multi-layer circuit substrate possessing six copper foil layers.

Next, through-holes possessing a copper plating layer on the interior wall surfaces were provided in this substrate in the same manner as in Practical Example 1. The adhesive force of the copper plating layer formed on the through-hole interior wall surfaces of this plate was strong and the rate at which plating separation and barrel cracking occurred due to temperature cycles was substantially reduced as compared with a conventional manufactured product wherein carbon is exposed by performing an alkali metal treatment on the through-hole interior wall surfaces and a copper plating layer is formed thereupon.

As described above, a multi-layer circuit substrate with a total thickness of 5.0 mm, a length of 500 mm, a width of 500 mm, and 1000 through-holes with a diameter of 0.4 mm, having a copper plating layer on the interior wall surfaces was manufactured. The quality and reliability of this circuit substrate were markedly enhanced as compared with the above conventional product.

PRACTICAL EXAMPLE 3

A composite ceramic substrate was manufactured by bonding an ePTFE porous body (with a porosity of 70% and a thickness of 100 μm) through lamination to the surface of the topmost layer of a multi-layer ceramic plate (with a thickness of 0.8 mm) possessing 10 conductive layers, including conductive layers (copper foil layers) formed on both surfaces. After through-holes were opened in this substrate, a photomask that would impart a desired circuit pattern was formed on the surface of this EPTFE porous body, the product immersed in a hydrophilization treatment solution containing a hydrophilic macromolecule, and dried. Next, a catalytic treatment, electroless copper plating, and photomask removal treatment were performed according to normal methods to give a circuit substrate with a total thickness of approximately 0.9 mm possessing a desired circuit pattern on the surface of the PTFE porous body and possessing a metal plating layer on the interior wall surfaces of the through-holes. In this circuit substrate, the circuit pattern formed on the surface of the EPTFE porous body formed a signal layer. In that this signal layer, with a specific inductive capacity of 1.25 and a dielectric loss tangent of $2.5 \times 10^{-4}$ (10 GHz), was formed on an EPTFE porous body, the transmission delays and wave-form distortions as well as cross talk were all markedly reduced in comparison with a substrate composed solely of a ceramic.

PRACTICAL EXAMPLE 4

An EPTFE porous body with a thickness of 80 μm was laminated on both surfaces of a polyimide film with a thickness of 50 via a thermoplastic fluororesin film adhesive and the laminate subjected to thermocompression bonding. The same treatments as were described in Practical Example 3 were performed on this substrate to give a flexible substrate possessing a metal plating layer on the through-hole interior wall surfaces and possessing a desired circuit pattern on both surfaces. Bending resistance tests (R=4.8 mm, 120 iterations/min.) were performed on this substrate in accordance with JPCA-SSF-1 resulting in a reliability confirmed up to 1,000,000 iterations.

PRACTICAL EXAMPLE 5

An EPTFE porous body wherein copper foil had been affixed to both surfaces, an EPTFE porous body, and a polyimide film were bonded through lamination in that order onto an EPTFE porous body. Next, this flexible sheet was subjected to the same treatments as in Practical Example 4 to produce a flexible sheet for a semiconductor chip (an IC chip) carrier possessing a circuit pattern composed of a metal plating layer on the surface of the topmost layer of an EPTFE porous body, a metal plating layer on the through-hole interior wall, a pattern for exterior terminals composed of a metal plating layer on the exterior surface of the polyimide film, and possessing sprocket holes in body edge portions.

Metal-To-Polymer Bond Strength

Figure 4:
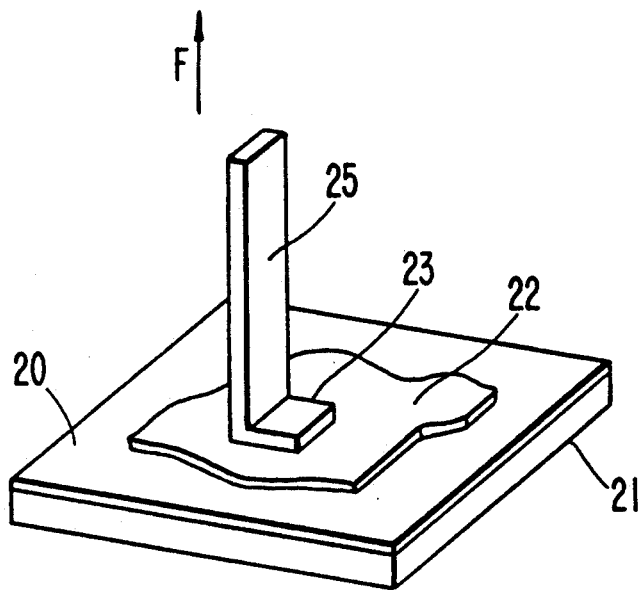
FIG. 4 is a perspective diagram of a bond-strength test apparatus.

The method used to determine the bond strength of metal to polymer is outlined in Method JIS H8504 and described in FIG. 4.

An EPTFE membrane 20 having a thickness of 40 microns porosity of 80%, and maximum pore size of 0.2 micron was bonded to a solid plate 21 with a double-sided adhesive tape. Copper plating 22 was applied to the open surface of the expanded porous PTFE to the following samples:

A. a hydrophilic resin layer formed on the open surface of the EPTFE membrane 20 which was varied in thickness.
B. a Tetra-Etch® (alkali metal-hydrocarbon compound) treated layer formed on the open surface of the EPTFE membrane 20 as a comparative example.
C. a layer coated with a fluorinated surface active agent (FC430-Fluorad®, Sumitomo-3M 0.5%) on the open surface of the ePTFE membrane 20 as a comparative example.
D. nothing as control.

The square contact plate 23 (5 mm×5 mm) of an L-shaped device was bonded on the copper plated surface 22 of the ePTFE membrane 20 with a double-sided adhesive tape. Then the solid plate 21 was fixed and the handle 25 of the L-shaped device was pulled to measure the delamination force between the copper layer 22 and the surface of the ePTFE membrane 20 in kgf.

| Coating | Thickness mg/cm. | Delamination Strength-kgf |
|---|---|---|
| Hydrophilic Resin Layer Coat | 0.01 | 0.5 |
| Hydrophilic Resin Layer Coat | 0.03 | 1.3 |
| Hydrophilic Resin Layer Coat | 0.1 | 1.5 |
| Hydrophilic Resin Layer Impregnated | 0.5 | 1.7 |
| Tetra-Etch Treated | — | 0.8 |
| FCH30-Fluorad ® Treated | — | 0.1 |
| Untreated | — | 0.01 |

We claim:
1. A sheet for an electronic circuit substrate and a semiconductor chip carrier comprising:
(a) a metallized fluororesin polymer sheet further comprising:
(i) a porous fluororesin polymer sheet;
(ii) a hydrophilic macromolecule film adhered to the interior pore surfaces and exterior surfaces of said fluororesin sheet;
(iii) at least one layer of metal film plated on the surface of said hydrophilic macromolecule film;
(b) at least one metal circuit pattern affixed to or metal-plated through-hole penetrating said metallized fluororesin polymer sheet.
2. A sheet of claim 1 laminated to a ceramic sheet.
3. A sheet of claim 1 in the form of a flexible film.
4. A sheet of claim 1 laminated to one or more insulative polymer sheets.
5. A sheet of claim 1 wherein said porous fluororesin polymer sheet comprises expanded polytetrafluoroethylene.

* * * * *